United States Patent
Lee et al.

(10) Patent No.: US 9,209,150 B2
(45) Date of Patent: Dec. 8, 2015

(54) EMBEDDED PACKAGES, METHODS OF FABRICATING THE SAME, ELECTRONIC SYSTEMS INCLUDING THE SAME, AND MEMORY CARDS INCLUDING THE SAME

(71) Applicant: SK hynix Inc., Icheon-si Gyeonggi-do (KR)

(72) Inventors: Sang Yong Lee, Icheon-si (KR); Qwan Ho Chung, Seoul (KR); Seung Jee Kim, Seongnam-si (KR); Jong Hyun Nam, Seoul (KR); Si Han Kim, Yongin-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/085,357

(22) Filed: Nov. 20, 2013

(65) Prior Publication Data
US 2014/0367851 A1 Dec. 18, 2014

(30) Foreign Application Priority Data

Jun. 13, 2013 (KR) .................. 10-2013-0067750

(51) Int. Cl.
*H01L 23/48* (2006.01)
*H01L 23/00* (2006.01)

(52) U.S. Cl.
CPC .............. *H01L 24/25* (2013.01); *H01L 24/24* (2013.01); *H01L 24/82* (2013.01); *H01L 2224/04105* (2013.01); *H01L 2224/24226* (2013.01); *H01L 2224/32225* (2013.01); *H01L 2224/73267* (2013.01); *H01L 2224/8203* (2013.01); *H01L 2224/92244* (2013.01)

(58) Field of Classification Search
CPC ............. H01L 2224/3225; H01L 2224/73267; H01L 2224/8203; H01L 2224/04105; H01L 2224/24226; H01L 2224/92244; H01L 24/25; H01L 24/82; H01L 24/24
USPC .................. 257/737–738, 788, 780–781, 784
See application file for complete search history.

(56) References Cited

U.S. PATENT DOCUMENTS

| 7,531,900 B2 | 5/2009 | Lin et al. |
| 2008/0111233 A1 | 5/2008 | Pendse |
| 2012/0273941 A1* | 11/2012 | Zeng ............................ 257/737 |

FOREIGN PATENT DOCUMENTS

KR 1020110001167 A 1/2011

* cited by examiner

*Primary Examiner* — Hoa B Trinh
(74) *Attorney, Agent, or Firm* — William Park & Associates Ltd.

(57) ABSTRACT

Embedded packages are provided. The embedded package includes a chip attached to a first surface of a core layer, a plurality of bumps on a surface of the chip opposite to the core layer, and a first insulation layer surrounding the core layer, the chip and the plurality of bumps. The first insulation layer has a trench disposed in a portion of the first insulation layer to expose the plurality of bumps.

16 Claims, 12 Drawing Sheets

EMBEDDED PACKAGES, METHODS OF FABRICATING THE SAME, ELECTRONIC SYSTEMS INCLUDING THE SAME, AND MEMORY CARDS INCLUDING THE SAME

CROSS-REFERENCE TO RELATED APPLICATION

The present application claims priority under 35 U.S.C 119(a) to Korean Application No. 10-2013-0067750, filed on Jun. 13, 2013, in the Korean intellectual property Office, which is incorporated herein by reference in its entirety as set forth in full.

BACKGROUND

1. Technical Field

Embodiments of the present disclosure relate to semiconductor packages and, more particularly, to embedded packages, methods of fabricating the same, electronic systems including the same, and memory cards including the same.

2. Related Art

As electronic systems become abruptly scaled down, spaces that semiconductor packages occupy in the electronic systems have been reduced. Thus, attempts to reduce the sizes of the semiconductor packages have been continuously made with the development of smaller electronic systems. In response to such a trend, embedded package techniques have been proposed to minimize the size of the semiconductor packages. According to the embedded package techniques, a semiconductor chip is not mounted on a surface of a package substrate. That is, the semiconductor chip of the embedded package may be embedded in the package substrate. Thus, the embedded package techniques may be advantageous in fabrication of small-sized packages. Further, since the chip of the embedded package is embedded in the package substrate, length of interconnection lines for electrically connecting the chip to the package substrate can be reduced to improve the drivability of the embedded package.

SUMMARY

Various embodiments are directed to embedded packages, methods of fabricating the same, electronic systems including the same, and memory cards including the same.

According to various embodiments, an embedded package includes a chip attached to a first surface of a core layer, a plurality of bumps on a surface of the chip opposite to the core layer, and a first insulation layer surrounding the core layer, the chip and the plurality of bumps. The first insulation layer has a trench disposed in a portion of the first insulation layer to expose the plurality of bumps.

According to various embodiments, an embedded package includes a chip attached to a first surface of a core layer, and a plurality of bumps classified into a first bump group and a second bump group disposed on a surface of the chip opposite to the core layer. The core layer, the chip and the plurality of bumps are surrounded by a first insulation layer. The first insulation layer includes a first trench exposing the bumps in the first bump group and a second trench exposing the bumps in the second bump group.

According to various embodiments, a method of fabricating an embedded package includes attaching a chip to a first surface of a core layer, forming a first insulation layer covering the core layer, the chip and a plurality of bumps, and removing a portion of the first insulation layer to form a trench that simultaneously exposed the plurality of bumps.

BRIEF DESCRIPTION OF THE DRAWINGS

Embodiments of the inventive concept will become more apparent in view of the attached drawings and accompanying detailed description, in which.

DETAILED DESCRIPTION

Figure 1:
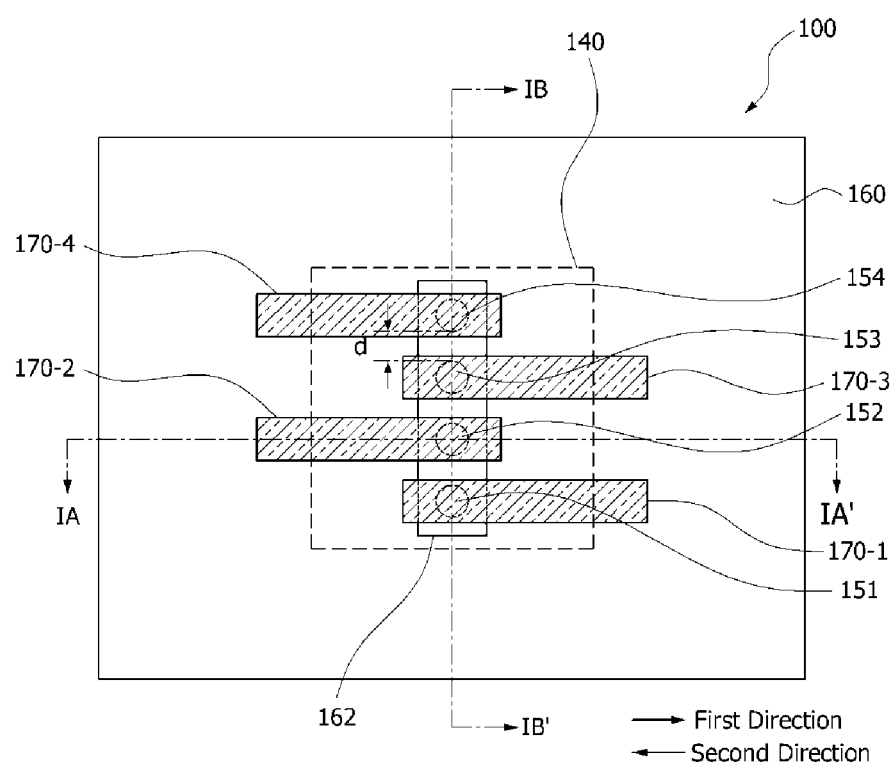
FIG. 1 is a plan view illustrating an embedded package according to an embodiment.

Referring to FIG. 1, an embedded package 100 may include a first insulation layer 160 and a chip 140 embedded in the first insulation layer 160. A plurality of bumps 151, 152, 153 and 154 may be disposed on a top surface of the chip 140. Although not shown in the drawings, these bumps 151, 152, 153 and 154 may be electrically connected to internal circuits disposed in the chip 140. Thus, the internal circuits may output electrical signals through the bumps 151, 152, 153 and 154 or may receive external signals through the bumps 151, 152, 153 and 154. In the embedded package 100 according to an embodiment, the bumps 151, 152, 153 and 154 may be disposed on a central region of the chip 140 to be adjacent to each other. For example, the bumps 151, 152, 153 and 154 may be disposed on the top surface of the chip 140 to be spaced apart from each other in a line which is perpendicular to a first direction or a second direction. Although an embodiment is described in conjunction with an example that the number of the bumps is four, the inventive concept is not limited thereto. For example, the number of the bumps may be greater than or less than four according to various embodiments.

While the top surface of the chip 140 is covered with the first insulation layer 160, top surfaces and upper sidewalls of the bumps 151, 152, 153 and 154 may be exposed by a single trench 162 disposed in the first insulation layer 160. In various embodiments, the trench 162 may expose only the top surfaces of the bumps 151, 152, 153 and 154. Interconnection lines 170-1, 170-2, 170-3 and 170-4 may be disposed on the first insulation layer 160 and the bumps 151, 152, 153 and 154. In various embodiments, one of the interconnection lines 170-1, 170-2, 170-3 and 170-4 may be disposed to contact one of the bumps 151, 152, 153 and 154. In various embodiments, the interconnection lines 170-1, 170-2, 170-3 and 170-4 may cover respective ones of the bumps 151, 152, 153 and 154 exposed by the trench 162 and may extend onto the first insulation layer 160 to be parallel with one direction. According to an embodiment, two interconnection lines immediately adjacent to each other may extend in opposite directions to each other. For example, the interconnection line 170-1 connected to the bump 151 may cover a portion of the trench 162 and may extend onto the first insulation layer 160 in a first direction, whereas the interconnection line 170-2 connected to the bump 152 and immediately adjacent to the interconnection line 170-1 may cover a portion of the trench 162 and may extend onto the first insulation layer 160 in a second direction which is an opposite direction to the first direction. Similarly, the interconnection line 170-3 immediately adjacent to the interconnection line 170-2 may extend onto the first insulation layer 160 in the first direction, and the interconnection line 170-4 immediately adjacent to the interconnection line 170-3 may extend onto the first insulation layer 160 in the second direction. According to an embodiment, even though a distance D between the bumps 151, 152, 153 and 154 is reduced, the bumps 151, 152, 153 and 154 may be fully exposed by the single trench 162. That is, an embodiment may solve some disadvantages that the bumps 151, 152, 153 and 154 cannot be fully exposed due to the misalignment occurred when the first insulation layer 160 is etched to form a plurality of via holes for exposing respective ones of the bumps 151, 152, 153 and 154.

Figure 2:
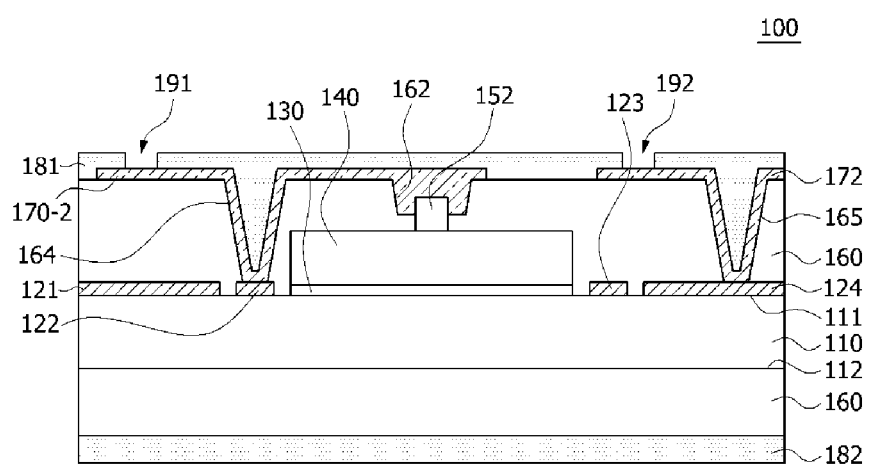
FIG. 2 is an example of a cross sectional view taken along a line IA-IA' of FIG. 1.
Figure 3:
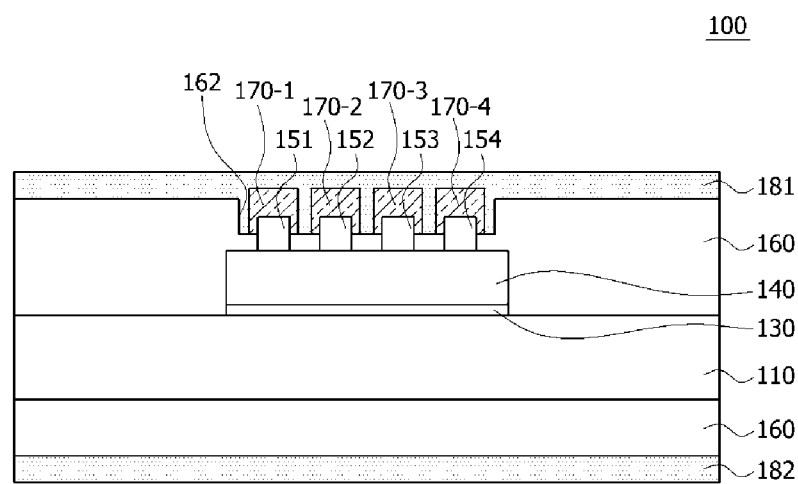
FIG. 3 is an example of a cross sectional view taken along a line IB-IB' of FIG. 1.

Referring to FIGS. 1, 2 and 3, a bottom surface of the chip 140 may be attached to a first surface 111 corresponding to a top surface of a core layer 110. In various embodiments, the core layer 110 may include a reinforcing base material and a resin material, for example, a glass fiber material and an epoxy material, a paper material and a phenol resin material, or a paper material and an epoxy resin material. As described above, the plurality of bumps 151, 152, 153 and 154 may be disposed on the top surface of the chip 140. That is, the plurality of bumps 151, 152, 153 and 154 may be disposed on the top surface of the chip 140 opposite to the core layer 110. In various embodiments, each of the bumps 151, 152, 153 and 154 may include a metal material. The bumps 151, 152, 153 and 154 may be arrayed along one direction to be spaced apart from each other in a line, as illustrated in FIGS. 1 and 3. An adhesive layer 130 may be disposed between the chip 140 and the core layer 110 to enhance an adhesive strength between the chip 140 and the core layer 110. In various embodiments, the chip 140 may be directly attached to the core layer 110 without use of the adhesive layer 130.

Although not shown in the drawings, the core layer 110 may include at least one via hole penetrating the core layer 110. A plurality of circuit patterns 121, 122, 123 and 124 may be disposed on the top surface 111 of the core layer 110. In various embodiments, at least one circuit pattern may be additionally disposed on a bottom surface 112 of the core layer 110. In the event that the core layer 110 has at least one via hole, at least one of the circuit patterns 121, 122, 123 and 124 may be electrically connected to the circuit pattern on the bottom surface 112 of the core layer 110 through the via hole. Further, although not shown in the drawings, at least two of the circuit patterns 121, 122, 123 and 124 may be electrically connected to each other. In various embodiments, each of the circuit patterns 121, 122, 123 and 124 may include a metal material.

The top surface 111 and the bottom surface 112 of the core layer 110, the top surface and sidewalls of the chip 140, and the circuit patterns 121, 122, 123 and 124 may be covered with the first insulation layer 160. In various embodiments, the first insulation layer 160 may be a material having an etch selectivity with respect to the bumps 151, 152, 153 and 154. Alternatively, the first insulation layer 160 may include a photosensitive material. As described above, the first insulation layer 160 may have the trench 162 exposing the plurality of bumps 151, 152, 153 and 154. The trench 162 may expose top surfaces and upper sidewalls of the bumps 151, 152, 153 and 154. The first insulation layer 160 may have via holes 164 and 165 that penetrate the first insulation layer 160 to expose the circuit patterns 122 and 124.

As described above, the plurality of interconnection lines 170-1, 170-2, 170-3 and 170-4 may be disposed on a surface of the first insulation layer 160. In various embodiments, the plurality of interconnection lines 170-1, 170-2, 170-3 and 170-4 may correspond to redistributed interconnection lines. The plurality of interconnection lines 170-1, 170-2, 170-3 and 170-4 may be spaced apart from each other to be insulated from each other. The plurality of interconnection lines 170-1, 170-2, 170-3 and 170-4 may be disposed to contact respective ones of the bumps 151, 152, 153 and 154 which are exposed by the trench 162. At least one of the interconnection lines 170-1, 170-2, 170-3 and 170-4 may be electrically connected to at least one of the circuit patterns 121, 122, 123 and 124 attached to the core layer 110. For example, the interconnection line 170-2 contacting the bump 152 may be electrically connected to the circuit pattern 122 through the via hole 164.

The interconnection line 170-2 may be disposed to surround the top surface and the upper sidewall of the bump 152, which are exposed by the trench 162. In such a case, the interconnection line 170-2 may be spaced apart from the interconnection lines 170-1 and 170-3 surrounding respective ones of the upper portions of the bumps 151 and 153 which are immediately adjacent to the bump 152. As described with reference to FIG. 1, the interconnection line 170-2 surrounding the upper portion of the bump 152 may cover a portion of the trench 162 and may extend in the second direction. The interconnection line 170-2 extending in the second direction may be electrically connected the circuit pattern 122 though the via hole 164 that penetrates the first insulation layer 160 to expose the circuit pattern 122 on the top surface 111 of the core layer 110.

In addition, an interconnection line 172 other than the interconnection lines 170-1, 170-2, 170-3 and 170-4 directly connected to respective ones of the bumps 151, 152, 153 and 154 may be additionally disposed on the first insulation layer 160. For the purpose of simplification of the drawing, the interconnection line 172 is not illustrated in FIG. 1. This interconnection line 172 may be electrically connected to the circuit pattern 124 on the top surface 111 of the core layer 110 through the via hole 165 penetrating the first insulation layer 160. The first insulation layer 160 may also be disposed to cover the bottom surface 112 of the core layer 110 in addition to the top surface 111 of the core layer 110 and the top surface of the chip 140, as illustrated in FIGS. 2 and 3. Although not shown in the drawings, at least one additional interconnection line may be disposed even on a bottom surface of the first insulation layer 160 contacting the bottom surface 112 of the core layer 110, and at least one additional circuit pattern may be disposed even on the bottom surface 112 of the core layer 110. In such a case, the at least one additional interconnection line may be electrically connected to the at least one additional circuit pattern through a via hole penetrating the first insulation layer 160 contacting the bottom surface 112 of the core layer 110.

A second insulation layer 181 may be disposed on the first insulation layer 160 and the interconnection lines 170-1, 170-2, 170-3, 170-4 and 172 which are stacked on the top surface 111 of the core layer 110. The interconnection lines 170-1, 170-2, 170-3, 170-4 and 172 may be insulated from each other by the second insulation layer 181. Portions of the interconnection lines 170-2 and 172 may be exposed by openings 191 and 192 that penetrate the second insulation layer 181. The exposed portions of the interconnection lines 170-2 and 172 may be covered with connectors, for example, solder balls through which electrical signals are inputted or outputted. A second insulation layer 182 may also be disposed on a bottom surface of the first insulation layer 160 contacting the bottom surface 112 of the core layer 110. For the purpose of simplification of the drawing, the second insulation layers 181 and 182 are not illustrated in FIG. 1. The second insulation layers 181 and 182 may be, for example, a solder resist layer.

Figure 4:
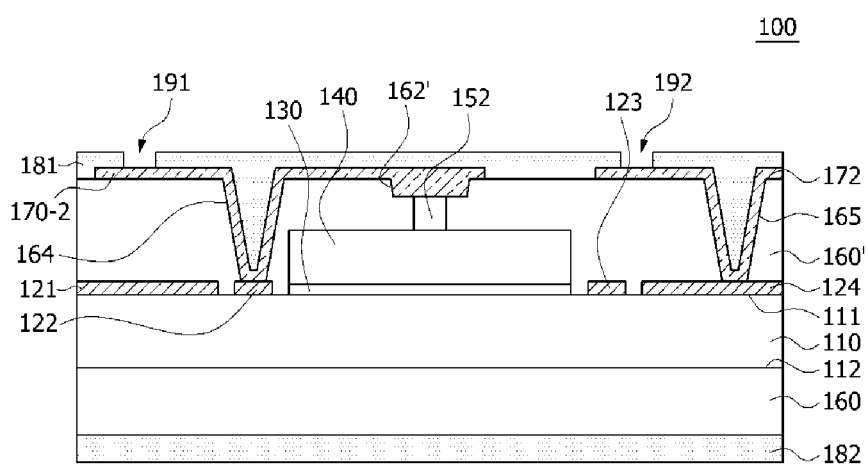
FIG. 4 is another example of a cross sectional view taken along a line IA-IA' of FIG. 1.
Figure 5:
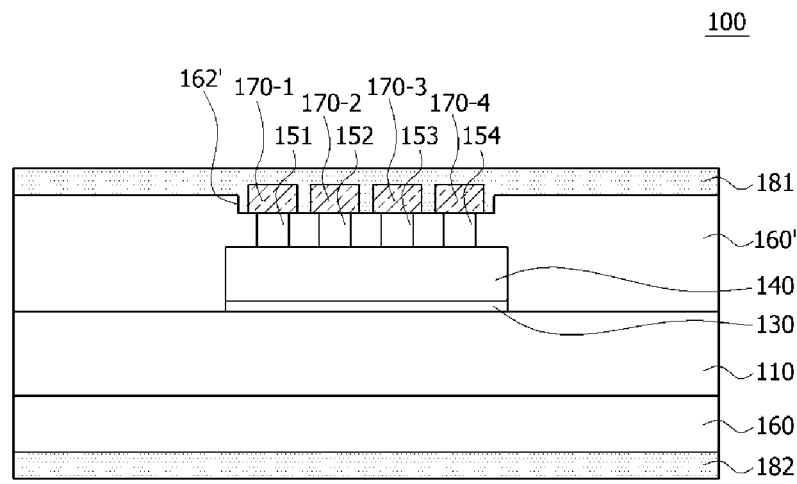
FIG. 5 is another example of a cross sectional view taken along a line IB-IB' of FIG. 1.

Referring to FIGS. 4 and 5, only the top surfaces of the bumps 151, 152, 153 and 154 may be exposed by a trench 162' which is formed in a first insulation layer 160'. That is, a bottom surface of the trench 162' may be coplanar with the top surfaces of the bumps 151, 152, 153 and 154. Thus, the interconnection lines 170-1, 170-2, 170-3 and 170-4 may be in contact with only the top surfaces of the bumps 151, 152, 153 and 154, respectively. In FIGS. 2, 3, 4 and 5, the same reference numerals indicate the same elements. Thus, descriptions to the same elements as set forth in an embodiment illustrated in FIGS. 2 and 3 will be omitted to avoid duplicate explanations.

Figure 6:
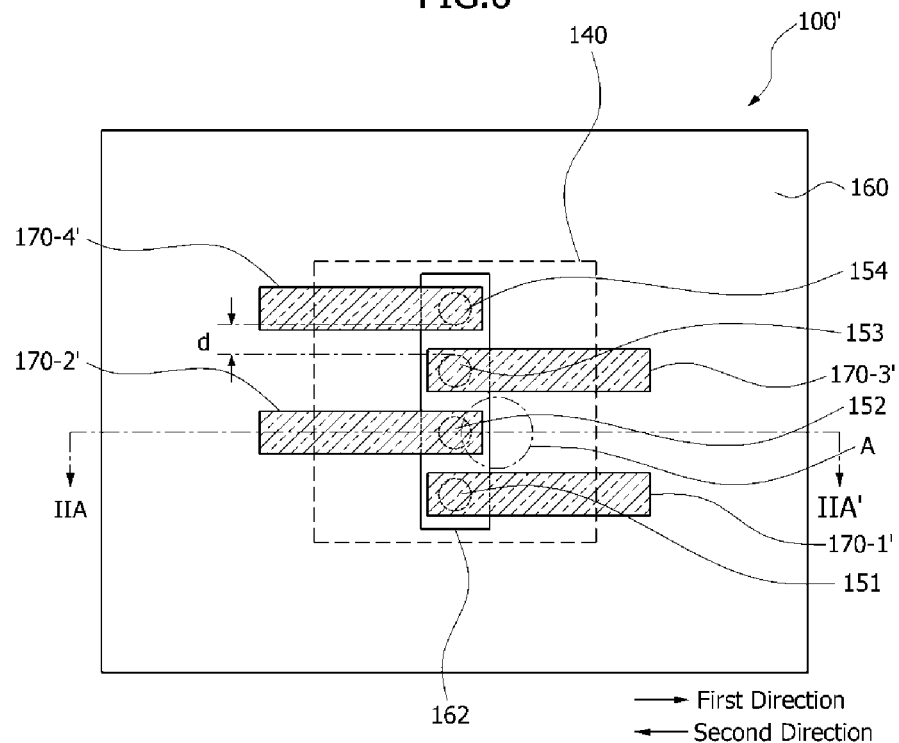
FIG. 6 is a plan view illustrating an embedded package according to an embodiment.
Figure 7:
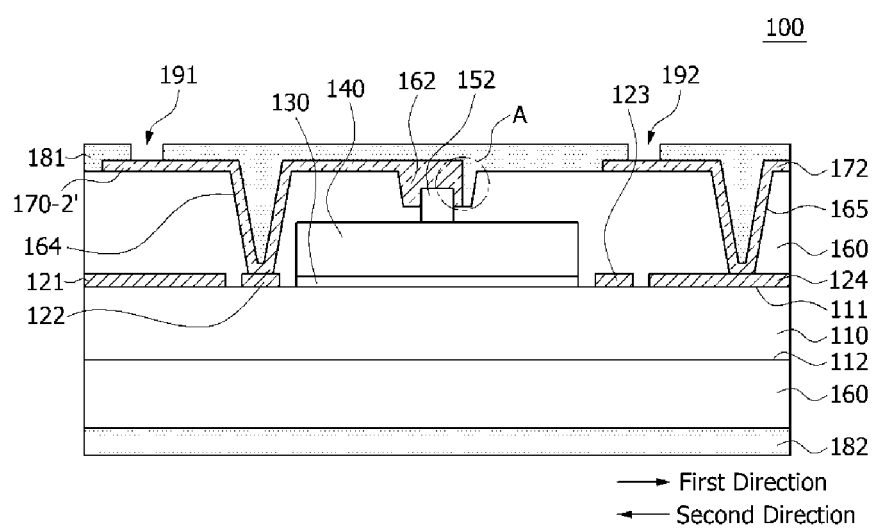
FIG. 7 is a cross sectional view taken along a line IIA-IIA' of FIG. 6.

Referring to FIGS. 6 and 7, each of interconnection lines 170-1', 170-2', 170-3' and 170-4' of an embedded package 100' according to various embodiments may be disposed to cover only one of opposite sidewalls of the trench 162 and to expose the other one of the opposite sidewalls of the trench 162. For example, the interconnection line 170-2' may be disposed to expose a sidewall of the trench 162 toward the first direction as indicated by a portion "A" and to cover another sidewall of the trench 162 toward the second direction that the interconnection line 170-2' extends. This structure of the interconnection lines 170-1', 170-2', 170-3' and 170-4' may also be equally applicable to an embodiment described with reference to FIGS. 4 and 5. In FIGS. 1, 2, 6 and 7, the same reference numerals indicate the same elements. Thus, descriptions to the same elements as set forth in an embodiment illustrated in FIGS. 1 and 2 will be omitted to avoid duplicate explanations. FIG. 6 also illustrates lines IIA and IIA' not illustrated in FIGS. 1 & 2.

Figure 8:
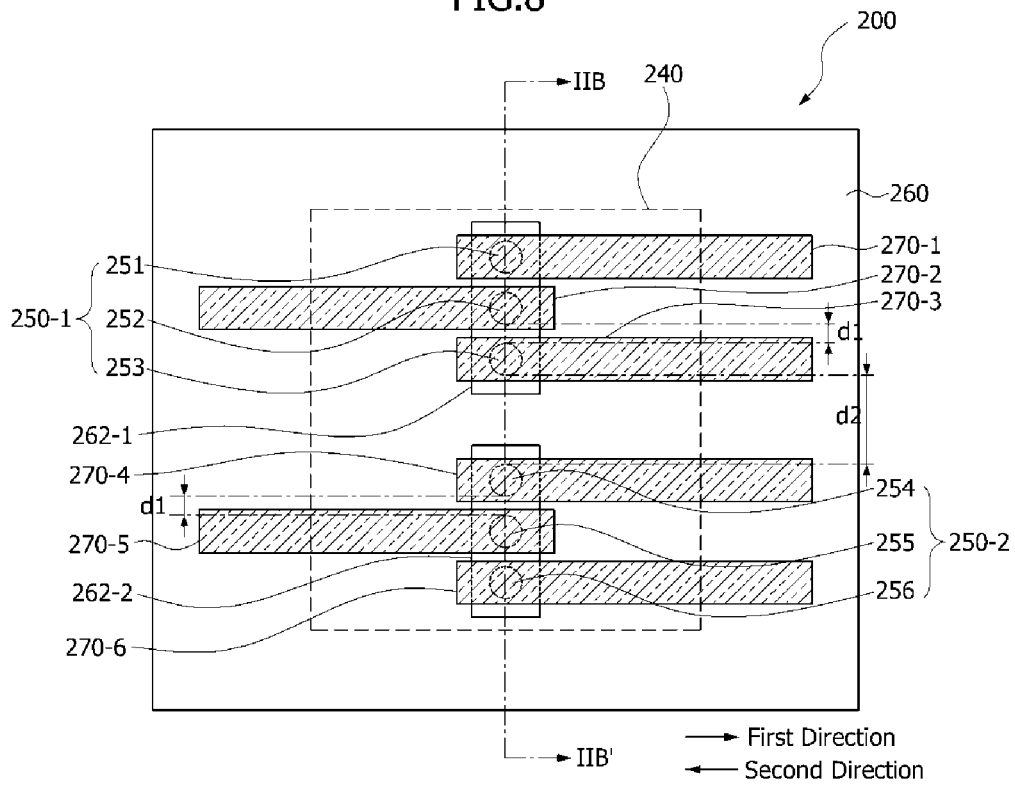
FIG. 8 is a plan view illustrating an embedded package according to an embodiment.
Figure 9:
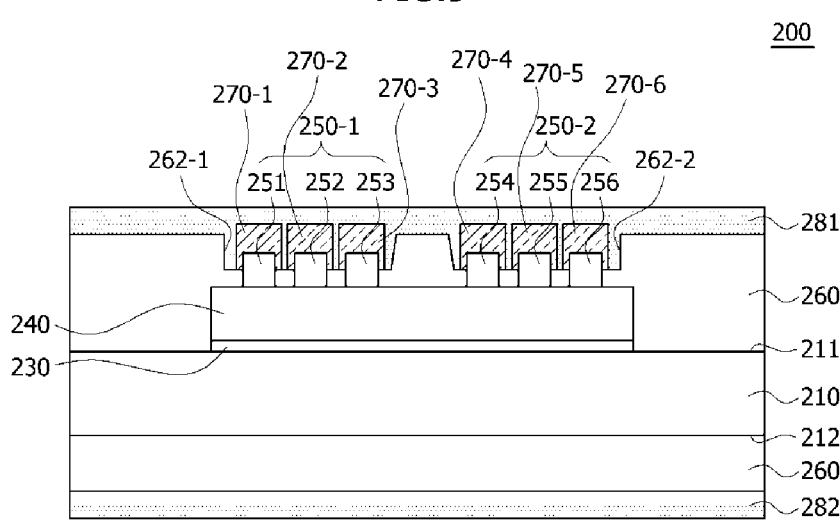
FIG. 9 is a cross sectional view taken along a line IIB-IIB' of FIG. 8.

Referring to FIGS. 8 and 9, an embedded package 200 according to various embodiments may include a core layer 210, a chip 240 disposed on a top surface 211 of the core layer 210, and a first insulation layer 260 covering the top surface 211 and a bottom surface 212 of the core layer 210 and a top surface and sidewalls of the chip 240. An adhesive layer 230 may be additionally disposed between the chip 240 and the core layer 210. In various embodiments, the chip 240 may be directly attached to the top surface 211 of the core layer 210 without use of the adhesive layer 230. A plurality of bumps 251, 252, 253, 254, 255 and 256 may be disposed on the top surface of the chip 240 opposite to the core layer 210. In the embedded package 200, the bumps 251, 252, 253, 254, 255 and 256 may be classified into a first bump group 250-1 and a second bump group 250-2. The first bump group 250-1 may include the bumps 251, 252 and 253 which are adjacent to each other and spaced apart from each other by a first distance D1, and the second bump group 250-2 may include the bumps 254, 255 and 256 which are adjacent to each other and spaced apart from each other by the first distance D1.

In the embedded package 200, the bumps 251, 252 and 253 of the first bump group 250-1 and the bumps 254, 255 and 256 of the second bump group 250-2 may be arrayed in a line perpendicular to first and second directions which are parallel with each other and opposite to each other when viewed from a plan view of FIG. 8. The bump 253 of the first bump group 250-1 closest to the second bump group 250-2 and the bump 254 of the second bump group 250-2 closest to the first bump group 250-1 may be spaced apart from each other by a second distance D2 which is greater than the first distance D1. In various embodiments, the distance between the bumps 251, 252 and 253 of the first bump group 250-1 may be different from the distance between the bumps 254, 255 and 256 of the second bump group 250-2. In any case, the distance between the bumps 251, 252 and 253 of the first bump group 250-1 and the distance between the bumps 254, 255 and 256 of the second bump group 250-2 may be less than the second distance D2. In various embodiments, the number of the bumps in the first bump group 250-1 may be greater or less than three. Similarly, the number of the bumps in the second bump group 250-2 may also be greater or less than three. As illustrated in FIG. 8 band 9, the number of the bumps in the first bump group 250-1 may be equal to the number of the bumps in the second bump group 250-2. However, the inventive concept is not limited thereto. For example, in various embodiments, the number of the bumps in the first bump group 250-1 may be different from the number of the bumps in the second bump group 250-2.

While the top surface of the chip 240 is covered with the first insulation layer 260, the bumps 251, 252, 253, 254, 255 and 256 on the chip 240 may be exposed by a first trench 262-1 and a second trench 262-2 disposed in the first insulation layer 260. The bumps 251, 252 and 253 in the first bump group 250-1 may be exposed by the first trench 262-1, and the bumps 254, 255 and 256 in the second bump group 250-2 may be exposed by the second trench 262-2. The first and second trenches 262-1 and 262-2 may be disposed to be spaced apart from each other. The first trench 262-1 may expose the top surfaces and upper sidewalls of the bumps 251, 252 and 253 in the first bump group 250-1. Similarly, the second trench 262-2 may expose the top surfaces and upper sidewalls of the bumps 254, 255 and 256 in the second bump group 250-2. However, in various embodiments, the first trench 262-1 may expose only the top surfaces of the bumps 251, 252 and 253 in the first bump group 250-1 and the second trench 262-2 may expose only the top surfaces of the bumps 254, 255 and 256 in the second bump group 250-2, as described with reference to FIGS. 4 and 5.

A plurality of interconnection lines 270-1, 270-2, 270-3, 270-4, 270-5 and 270-6 may be disposed on the first insulation layer 260. In various embodiments, the plurality of interconnection lines 270-1, 270-2, 270-3, 270-4, 270-5 and 270-6 may correspond to redistributed interconnection lines. The plurality of interconnection lines 270-1, 270-2, 270-3, 270-4, 270-5 and 270-6 may be spaced apart from each other to be insulated from each other. The plurality of interconnection lines 270-1, 270-2 and 270-3 may be disposed to contact respective ones of the bumps 251, 252 and 253 in the first bump group 250-1 which are exposed by the first trench 262-1. Similarly, the plurality of interconnection lines 270-4, 270-5 and 270-6 may be disposed to contact respective ones of the bumps 254, 255 and 256 in the second bump group 250-2 which are exposed by the second trench 262-2. Although not shown in the drawings, at least one of the interconnection lines 270-1, 270-2, 270-3, 270-4, 270-5 and 270-6 may be electrically connected to at least one of circuit patterns (not shown) on the core layer 210 through a via hole penetrating the first insulation layer 260.

The interconnection lines 270-1, 270-2 and 270-3 may be disposed to surround respective ones of upper portions (i.e., top surfaces and upper sidewalls) of the bumps 251, 252 and 253 in the first bump group 250-1 exposed by the first trench 262-1. Further, the interconnection lines 270-4, 270-5 and 270-6 may be disposed to surround respective ones of upper portions (i.e., top surfaces and upper sidewalls) of the bumps 254, 255 and 256 in the second bump group 250-2 exposed by the second trench 262-2. In the event that the first and second trenches 262-1 and 262-2 expose only the top surfaces of the bumps 251, 252, 253, 254, 255 and 256 as described with reference to FIGS. 4 and 5, the interconnection lines 270-1, 270-2 and 270-3 may be disposed to cover only the top surfaces of the bumps 251, 252 and 253 in the first bump group 250-1 exposed by the first trench 262-1 and the interconnection lines 270-4, 270-5 and 270-6 may be disposed to cover only the top surfaces of the bumps 254, 255 and 256 in the second bump group 250-2 exposed by the second trench 262-2.

Each of the interconnection lines 270-1, 270-2 and 270-3 may cover a portion of the first trench 262-1 and may extend onto the first insulation layer 260 in a first direction or a second direction opposite to the first direction. Two adjacent interconnection lines of the interconnection lines 270-1, 270-2 and 270-3 may extend in opposite directions to each other. For example, the interconnection line 270-1 connected to the bump 251 may cover a portion of the first trench 262-1 and may extend onto the first insulation layer 260 in the first direction, whereas the interconnection line 270-2 connected to the bump 252 and immediately adjacent to the interconnection line 270-1 may cover a portion of the first trench 262-1 may extend onto the first insulation layer 260 in the second direction which is an opposite direction to the first direction. Further, the interconnection line 270-3 immediately adjacent to the interconnection line 270-2 may cover a portion of the first trench 262-1 and may extend onto the first insulation layer 260 in the first direction.

Similarly, each of the interconnection lines 270-4, 270-5 and 270-6 may cover a portion of the second trench 262-2 and may extend onto the first insulation layer 260 in the first direction or the second direction opposite to the first direction. Two adjacent interconnection lines of the interconnection lines 270-4, 270-5 and 270-6 may extend in opposite directions to each other. For example, the interconnection line 270-4 connected to the bump 254 may cover a portion of the second trench 262-2 and may extend onto the first insulation layer 260 in the first direction, whereas the interconnection line 270-5 connected to the bump 255 and immediately adjacent to the interconnection line 270-4 may cover a portion of the second trench 262-2 may extend onto the first insulation layer 260 in the second direction which is an opposite direction to the first direction. Further, the interconnection line 270-6 immediately adjacent to the interconnection line 270-5 may cover a portion of the second trench 262-2 and may extend onto the first insulation layer 260 in the first direction. In various embodiments, each of the interconnection lines 270-1, 270-2, 270-3, 270-4, 270-5 and 270-6 may be disposed to expose one sidewall of opposite sidewalls of the first or second trench 262-1 or 262-2, as described with reference to FIGS. 6 and 7. FIG. 8 also illustrates lines IIB and IIB' not illustrated in FIG. 6 or 7.

Although not shown in the drawings, at least one additional interconnection line other than the interconnection lines 270-1, 270-2, 270-3, 270-4, 270-5 and 270-6 directly connected to respective ones of the bumps 251, 252, 253, 254, 255 and 256 may also be disposed on the first insulation layer 160. In such a case, the additional interconnection line may be electrically connected to a circuit pattern on the top surface 211 of the core layer 210 through a via hole penetrating the first insulation layer 260. Further, although not shown in the drawings, at least one additional interconnection line may also be disposed even on a bottom surface of the first insulation layer 260 contacting the bottom surface 212 of the core layer 210, and at least one additional circuit pattern may be disposed even on the bottom surface 212 of the core layer 210. In such a case, the at least one additional interconnection line may be electrically connected to the at least one additional circuit pattern through a via hole penetrating the first insulation layer 260 contacting the bottom surface 212 of the core layer 210.

A second insulation layer 281 may be disposed on the first insulation layer 260 and the interconnection lines 270-1, 270-2, 270-3, 270-4, 270-5 and 270-6 which are stacked on the top surface 211 of the core layer 210. The interconnection lines 270-1, 270-2, 270-3, 270-4, 270-5 and 270-6 may be insulated from each other by the second insulation layer 281. At least one of the interconnection lines 270-1, 270-2, 270-3, 270-4, 270-5 and 270-6 may be exposed by at least one opening that penetrates the second insulation layer 281. The exposed portion of the at least one of the interconnection lines 270-1, 270-2, 270-3, 270-4, 270-5 and 270-6 may be covered with a connector, for example, a solder ball through which an electrical signal is inputted or outputted. A second insulation layer 282 may also be disposed on a bottom surface of the first insulation layer 260 contacting the bottom surface 212 of the core layer 210. The second insulation layers 281 and 282 may be, for example, a solder resist layer.

Figure 10:
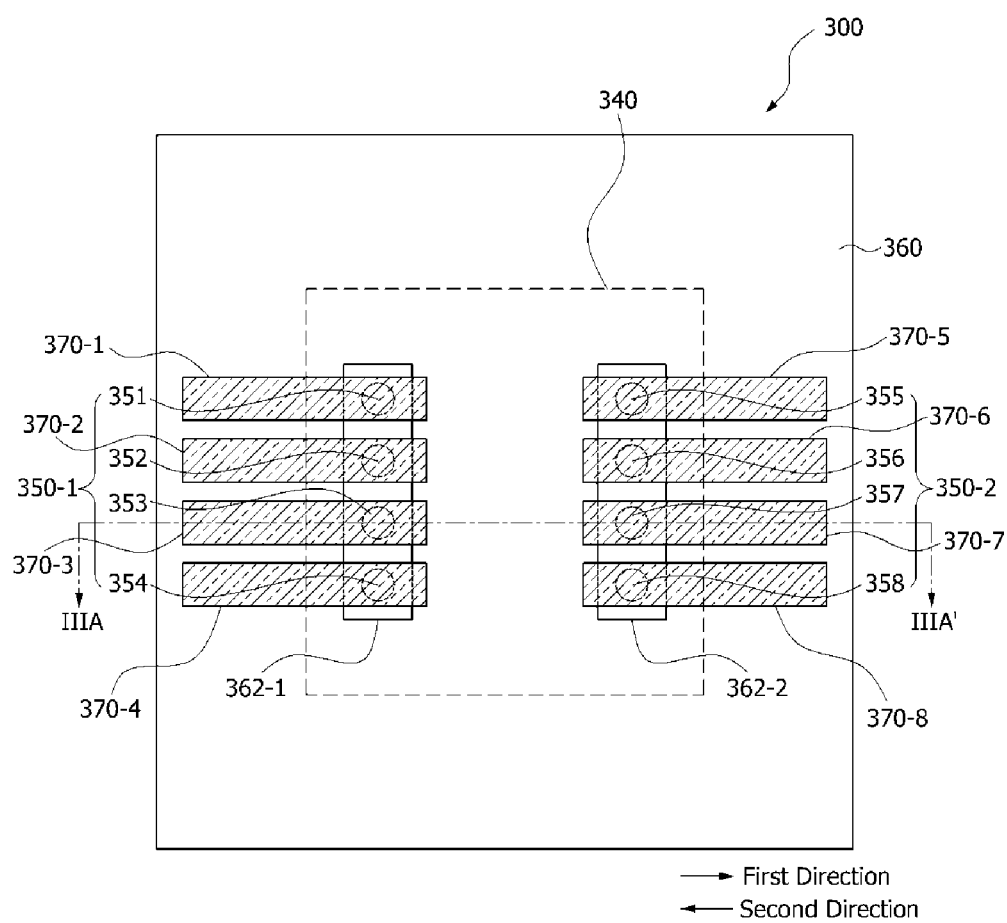
FIG. 10 is a plan view illustrating an embedded package according to an embodiment.

Referring to FIG. 10, an embedded package 300 according to various embodiments may include a first insulation layer 360 and a chip 340 embedded in the first insulation layer 360. A plurality of bumps 351, 352, 353, 354, 355, 356, 357 and 358 may be disposed on a top surface of the chip 340. The plurality of bumps 351, 352, 353, 354, 355, 356, 357 and 358 on the chip 340 may be classified into a first bump group 350-1 and a second bump group 350-2. The first bump group 350-1 may include the bumps 351, 352, 353 and 354 which are arrayed in a line on a first edge of the chip 340. The second bump group 350-1 may include the bumps 355, 356, 357 and 358 which are arrayed in a line on a second edge of the chip 340 opposite to the first edge. The bumps 351, 352, 353 and 354 in the first bump group 350-1 may be arrayed in a direction parallel with a first sidewall adjacent to the first edge of the chip 340, and the bumps 355, 356, 357 and 358 in the second bump group 350-2 may be arrayed in a direction parallel with a second sidewall adjacent to the second edge of the chip 340. That is, the bumps 351, 352, 353 and 354 in the first bump group 350-1 and the bumps 355, 356, 357 and 358 in the second bump group 350-2 may be arrayed in a direction which is perpendicular to a first direction and a second direction anti-parallel with the first direction when viewed from a plan view of FIG. 10. Lines IIIA and IIIA' are also illustrated in FIG. 10. In various embodiments, the number of the bumps in the first bump group 350-1 may be greater or less than four, and the number of the bumps in the second bump group 350-2 may also be greater or less than four. As illustrated in FIG. 10, the number of the bumps in the first bump group 350-1 may be equal to the number of the bumps in the second bump group 350-2. However, the inventive concept is not limited thereto. For example, in various embodiments, the number of the bumps in the first bump group 350-1 may be different from the number of the bumps in the second bump group 350-2.

While the top surface of the chip 340 is covered with the first insulation layer 360, the bumps 351, 352, 353, 354, 355, 356, 357 and 358 on the chip 340 may be exposed by a first trench 362-1 and a second trench 362-2 in the first insulation layer 360. In more detail, the bumps 351, 352, 353 and 354 in the first bump group 350-1 may be exposed by the first trench 362-1, and the bumps 355, 356, 357 and 358 in the second bump group 350-2 may be exposed by the second trench 362-2.

A plurality of interconnection lines 370-1, 370-2, 370-3 and 370-4 may cover respective ones of the bumps 351, 352, 353 and 354 and may extend onto the first insulation layer 360. Further, a plurality of interconnection lines 370-5, 370-6, 370-7 and 370-8 may cover respective ones of the bumps 355, 356, 357 and 358 and may extend onto the first insulation layer 360. That is, one of the interconnection lines 370-1, 370-2, 370-3, 370-4, 370-5, 370-6, 370-7 and 370-8 may contact one of the bumps 351, 352, 353, 354, 355, 356, 357 and 358. The interconnection lines 370-1, 370-2, 370-3 and 370-4 may cover the bumps 351, 352, 353 and 354 and may extend onto the first insulation layer 360 in the second direction. The interconnection lines 370-5, 370-6, 370-7 and 370-8 may cover the bumps 355, 356, 357 and 358 and may extend onto the first insulation layer 360 in the first direction. In various embodiments, the interconnection lines 370-1, 370-2, 370-3 and 370-4 may be disposed to expose a sidewall of the first trench 362-1 toward the first direction, as described with reference to FIGS. 6 and 7. Similarly, the interconnection lines 370-5, 370-6, 370-7 and 370-8 may be disposed to expose a sidewall of the second trench 362-2 toward the second direction, as described with reference to FIGS. 6 and 7.

Figure 11:
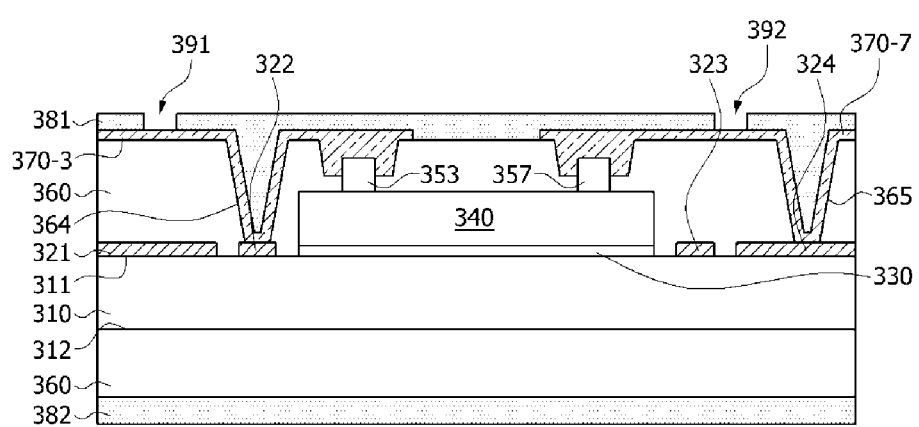
FIG. 11 is a cross sectional view taken along a line IIIA-IIIA' of FIG. 10.

Referring to FIGS. 10 and 11, the chip 340 may be attached to a top surface 311 of a core layer 310. In such a case, a bottom surface of the chip 340 may contact the top surface 311 of the core layer 310. The bumps 351, 352, 353, 354, 355, 356, 357 and 358 may be disposed on the top surface of the chip 340 opposite to the core layer 310. An adhesive layer 330 may be disposed between the chip 340 and the core layer 310 to enhance an adhesive strength between the chip 340 and the core layer 310. In various embodiments, the chip 340 may be directly attached to the top surface 311 of the core layer 310 without use of the adhesive layer 330. Although not shown in the drawings, the core layer 310 may have at least one via hole penetrating the core layer 310. A plurality of circuit patterns 321, 322, 323 and 324 may be disposed on the top surface 311 of the core layer 310. In various embodiments, at least one additional circuit pattern may be disposed on a bottom surface 312 of the core layer 310. When the core layer 310 has at least one via hole penetrating the core layer 310, at least one of the circuit patterns 321, 322, 323 and 324 on the top surface 311 of the core layer 310 may be electrically connected to the additional circuit pattern on the bottom surface 312 of the core layer 310 through the via hole penetrating the core layer 310. Although not shown in the cross sectional view of FIG. 11, at least two circuit patterns of the circuit patterns 321, 322, 323 and 324 may be electrically connected to each other.

As illustrated in FIG. 11, the top surface 311 and the bottom surface 312 of the core layer 310, the top surface and sidewalls of the chip 340, and the circuit patterns 321, 322, 323 and 324 may be covered with the first insulation layer 360. Further, the first insulation layer 360 may have the first trench 362-1 exposing the bumps 351, 352, 353 and 354 of the first bump group 350-1 and the second trench 362-2 exposing the bumps 355, 356, 357 and 358 of the second bump group 350-2. According to the an embodiment, an upper portion (i.e., a top surface and upper sidewalls) of each of the bumps 351, 352, 353, 354, 355, 356, 357 and 358 may be exposed the first trench 362-1 or the second trench 362-2. Alternatively, the first and second trenches 362-1 and 362-2 may expose only the top surfaces of the bumps 351, 352, 353, 354, 355, 356, 357 and 358, as described with reference to FIGS. 4 and 5. A portion of the circuit pattern 322 may be exposed by a via hole 364 penetrating the first insulation layer 360 and a portion of the circuit pattern 324 may be exposed by a via hole 365 penetrating the first insulation layer 360.

As described above, the interconnection lines 370-1, 370-2, 370-3, 370-4, 370-5, 370-6, 370-7 and 370-8 may cover the bumps 351, 352, 353, 354 355, 356, 357 and 358 and may extend onto the first insulation layer 360. In various embodiments, the interconnection lines 370-1, 370-2, 370-3, 370-4, 370-5, 370-6, 370-7 and 370-8 may correspond to redistributed interconnection lines. The interconnection lines 370-1, 370-2, 370-3, 370-4, 370-5, 370-6, 370-7 and 370-8 may be spaced apart from each other to be insulated from each other. The interconnection lines 370-1, 370-2, 370-3, 370-4, 370-5, 370-6, 370-7 and 370-8 may be disposed to contact respective ones of the bumps 351, 352, 353, 354 355, 356, 357 and 358 which are exposed by the first and second trenches 362-1 and 362-2. Each of the interconnection lines 370-1, 370-2, 370-3, 370-4, 370-5, 370-6, 370-7 and 370-8 may be electrically connected to at least one of the circuit patterns 321, 322, 323 and 324. For example, the interconnection line 370-3 contacting the bump 353 may be electrically connected to the circuit pattern 322 through the via hole 364, and the interconnection line 370-7 contacting the bump 357 may be electrically connected to the circuit pattern 324 through the via hole 365.

Although not shown in the drawings, at least one additional interconnection line may also be disposed even on a bottom surface of the first insulation layer 360 contacting the bottom surface 312 of the core layer 310, and at least one additional circuit pattern may be disposed even on the bottom surface 312 of the core layer 310. In such a case, the at least one additional interconnection line may be electrically connected to the at least one additional circuit pattern through a via hole penetrating the first insulation layer 360 contacting the bottom surface 312 of the core layer 310.

A second insulation layer 381 may be disposed on the first insulation layer 360 and the interconnection lines 370-1, 370-2, 370-3, 370-4, 370-5, 370-6, 370-7 and 370-8 stacked on the top surface 311 of the core layer 310. The interconnection lines 370-1, 370-2, 370-3, 370-4, 370-5, 370-6, 370-7 and 370-8 may be insulated from each other by the second insulation layer 381. The interconnection lines 370-1, 370-2, 370-3, 370-4, 370-5, 370-6, 370-7 and 370-8 may be exposed by openings that penetrate the second insulation layer 381. For example, a portion of the interconnection line 370-3 may be exposed by an opening 391 that penetrates the second insulation layer 381, and a portion of the interconnection line 370-7 may be exposed by an opening 392 that penetrates the second insulation layer 381. Although not shown in the drawings, the other interconnection lines may also be exposed by other openings that penetrate the second insulation layer 381. Connectors, for example, solder balls may be attached to the interconnection lines 370-3 and 370-7 exposed by the openings 391 and 392. Output signals generated from the embedded package 300 may be transmitted to an external device through the connectors or the embedded package 300 may receive external signals generated from an external device through the connectors. Further, a second insulation layer 382 may also be disposed on a bottom surface of the first insulation layer 360 contacting the bottom surface 312 of the core layer 310. In various embodiments, the second insulation layers 381 and 382 may be, for example, a solder resist layer.

FIGS. 12 to 19 are cross sectional views illustrating a method of fabricating an embedded package according to various embodiments. FIGS. 12, 14, 16 and 18 are cross sectional views taken along a line IA-IA' of FIG. 1, and FIGS. 13, 15, 17 and 19 are cross sectional views taken along a line IB-IB' of FIG. 1.

Figure 12:
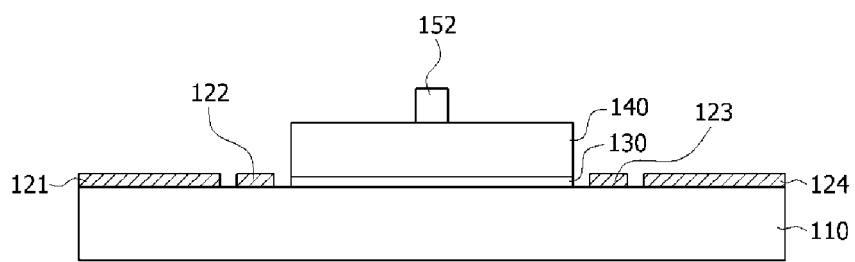
FIGS. 12 to 19 are cross sectional views illustrating a method of fabricating an embedded package according to various embodiments.
Figure 13:
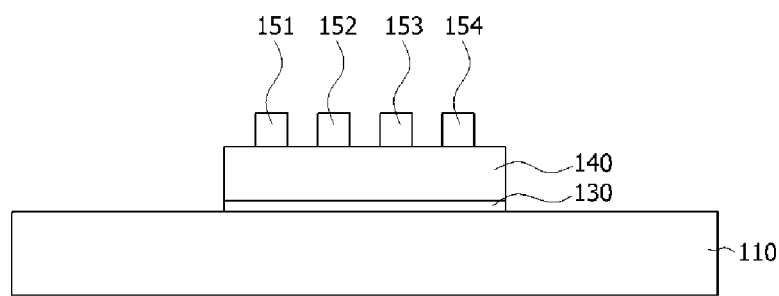

Referring to FIGS. 12 and 13, a core layer 110 may be prepared. The core layer 110 may have at least one via hole penetrating the core layer 110. In various embodiments, the core layer 110 may be formed to include a reinforcing base material and a resin material, for example, a glass fiber material and an epoxy material, a paper material and a phenol resin material, or a paper material and an epoxy resin material. A plurality of circuit patterns 121, 122, 123 and 124 having diverse configurations may be formed on a top surface of the core layer 110. At least one additional circuit pattern may also be formed on a bottom surface of the core layer 110. In such a case, at least one of the circuit patterns 121, 122, 123 and 124 on the top surface of the core layer 110 may be electrically connected to the additional circuit pattern on the bottom surface of the core layer 110 through the via hole penetrating the core layer 110.

A chip 140 may be attached to the top surface of the core layer 110 using an adhesive layer 130. The chip 140 may have a bottom surface attached to the core layer 110 and a top surface opposite to the bottom surface. A plurality of bumps 151, 152, 153 and 154 may be disposed on the top surface of the chip 140. In various embodiments, the bumps 151, 152, 153 and 154 may be formed on the top surface of the chip 140 before the chip 140 is attached to the core layer 110. The bumps 151, 152, 153 and 154 may be formed to have diverse configurations. In an embodiment, the bumps 151, 152, 153 and 154 may be formed to have the configuration which is illustrated in FIG. 1. That is, the bumps 151, 152, 153 and 154 may be formed to be spaced apart from each other on a central region of the top surface of the chip 140 and to be arrayed in a line which is parallel with one direction. However, an array or disposition of the bumps 151, 152, 153 and 154 is not limited to the above description. For example, the bumps 151, 152, 153 and 154 may be formed to have the same array or disposition as illustrated in FIG. 8 or FIG. 10. In various embodiments, the bumps 151, 152, 153 and 154 may be formed to have another configuration different from the arrays of FIGS. 1, 8 and 10.

Figure 14:
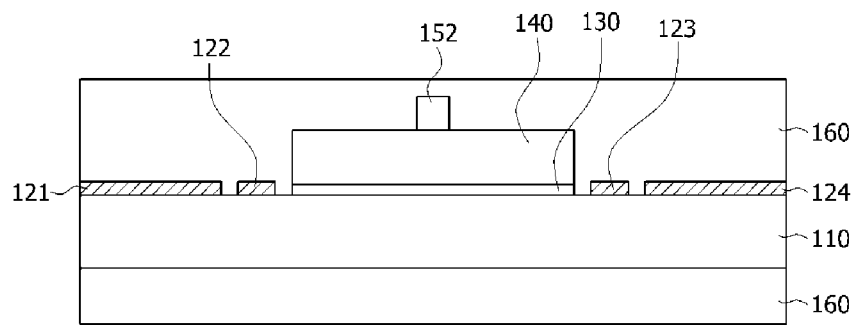
Figure 15:
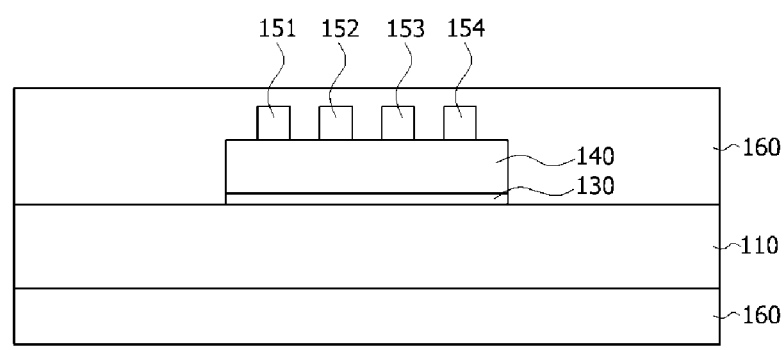

Referring to FIGS. 14 and 15, a first insulation layer 160 may be formed to cover the core layer 110, the chip 140, the bumps 151, 152, 153 and 154, and the circuit patterns 121, 122, 123 and 124. In various embodiments, the first insulation layer 160 may be formed of a material having an etch selectivity with respect to the bumps 151, 152, 153 and 154. Alternatively, the first insulation layer 160 may be formed of a photosensitive material. The first insulation layer 160 may be formed using a method of coating an insulation material or using a laminating method with heat and pressure.

Figure 16:
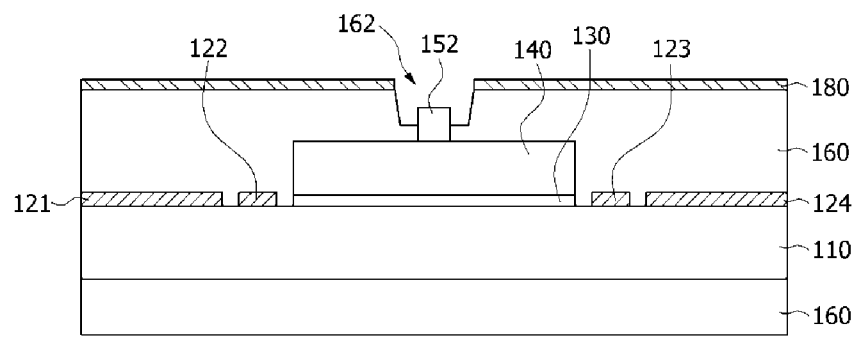
Figure 17:
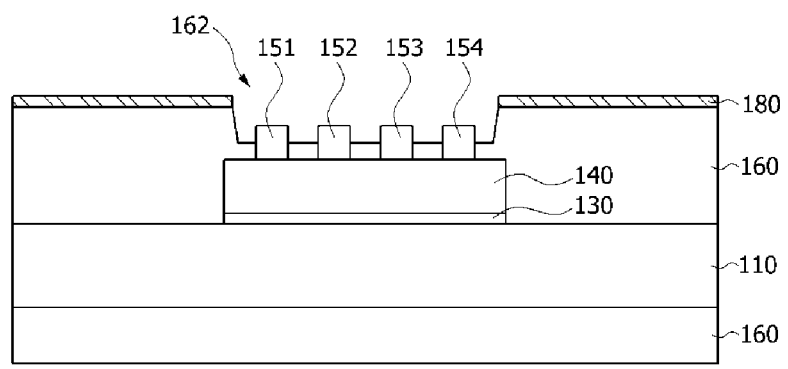

Referring to FIGS. 16 and 17, a mask pattern 180 may be formed on the first insulation layer 160. The mask pattern 180 may be formed to have an opening that exposes a portion of the first insulation layer 160. Specifically, the mask pattern 180 may be formed by deposing a mask layer on the first insulation layer 160, by forming a photoresist pattern exposing a portion of the mask layer on the mask layer, and by selectively removing the exposed portion of the mask layer. The exposed portion of the mask layer may be selectively removed using a dry etching process with plasma, a wet etching process or a laser process according to the material of the mask layer. After the mask pattern 180 is formed, the photoresist pattern may be removed. The portion of the first insulation layer 160 exposed by the mask pattern 180 may overlap with the bumps 151, 152, 153 and 154 when viewed from a plan view. The mask layer may be formed by the same process as used in formation of the first insulation layer 160. For example, the mask layer may be formed using a laminating method. The mask pattern 180 may be formed of a metal layer, but not limited thereto. For example, the mask pattern 180 may be formed of any material having a mask function while the exposed portion of the first insulation layer 160 is selectively removed. The first insulation layer 160 may be etched using the mask pattern 180 as an etch mask to form a trench 162 that simultaneously exposes upper portions of the bumps 151, 152, 153 and 154. The etching process for forming the trench 162 may be performed using a dry etch technique with plasma or a wet etch technique with a chemical etchant. Alternatively, the etching process for forming the trench 162 may be performed using a laser process. After the trench 162 is formed, the mask pattern 180 may be removed.

Although an embodiment is described in conjunction with an example that the trench 162 is formed using the mask pattern 180, the inventive concept is not limited thereto. For example, the trench 162 may be formed using a light irradiation process or a laser process. In the event that the trench 162 is formed using a light irradiation process, the first insulation layer 160 may be formed of a photoresist layer. In such a case, ultraviolet (UV) rays may be selectively irradiated onto a portion of the first insulation layer 160 without use of the mask pattern 180 to change a material property of the irradiated portion of the first insulation layer 160 and the irradiated portion of the first insulation layer 160 may be selectively removed to form the trench 162. Even when the trench 162 is formed using a laser process, the trench 162 may be formed without use of the mask pattern 180 if the first insulation layer 160 is formed of a material which can be removed using a laser. In such a case, a portion of the first insulation layer 160 may be selectively removed using a laser.

Figure 18:
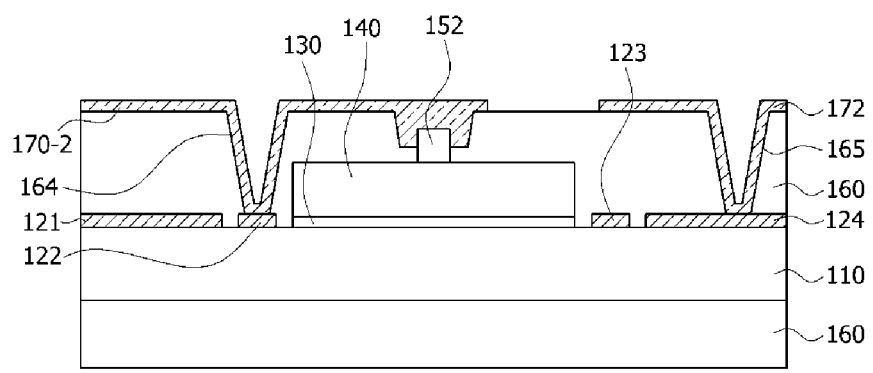
Figure 19:
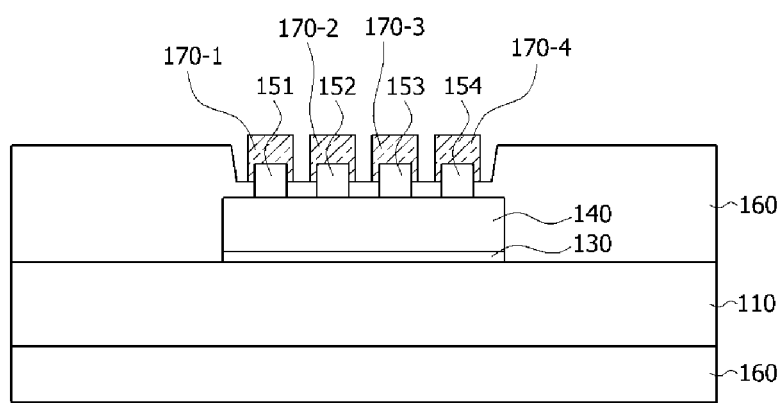

Referring to FIGS. 18 and 19, portions of the first insulation layer 160 may be selectively removed to form via holes 164 and 165 exposing respective ones of the circuit patterns 122 and 124 disposed on the core layer 110. In various embodiments, the via holes 164 and 165 are formed using a laser process. Subsequently, a plurality of interconnection lines 170-1, 170-2, 170-3 and 170-4 may be formed on the first insulation layer 160. The interconnection lines 170-1, 170-2, 170-3 and 170-4 may be formed to contact respective ones of the bumps 151, 152, 153 and 154. During formation of the interconnection lines 170-1, 170-2, 170-3 and 170-4, at least one additional interconnection line 172 may also be formed on the first insulation layer 160. The additional interconnection line 172 may not be connected to the bumps 151, 152, 153 and 154. The interconnection lines 170-1, 170-2, 170-3, 170-4 and 172 may be formed by depositing a conductive layer such as a metal layer on the first insulation layer 160 and by patterning the conductive layer using a general process known in the art.

Subsequently, as illustrated in FIGS. 2 and 3, a second insulation layer 181 may be formed on the interconnection lines 170-1, 170-2, 170-3, 170-4 and 172 and the first insulation layer 160. During formation of the second insulation layer 181, another second insulation layer 182 may also be formed on a bottom surface of the first insulation layer 160 contacting the bottom surface of the core layer 110. The second insulation layers 181 and 182 may be formed of a solder resist layer. The second insulation layer 181 may then be patterned to form via holes exposing portions of the interconnection lines 170-2 and 172. Although not shown in the drawings, other via holes exposing portions of the interconnection lines 170-1, 170-3 and 170-4 may also be formed during formation of the via holes exposing portions of the interconnection lines 170-2 and 172.

Figure 20:
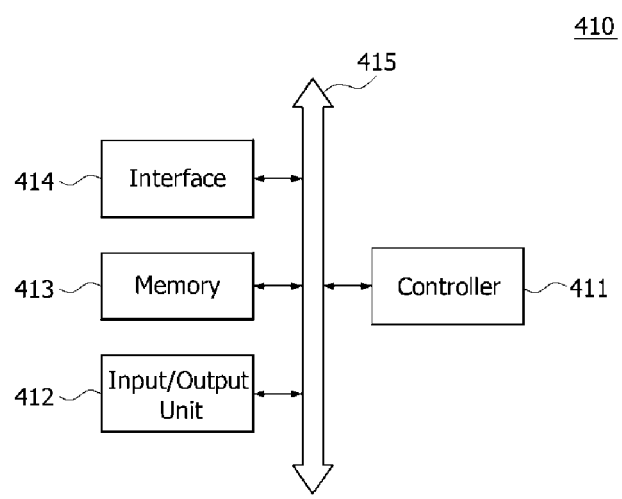
FIG. 20 is a block diagram illustrating an example of an electronic system including the embedded package in accordance with various embodiments of the inventive concept.

Referring to FIG. 20, the embedded package in accordance with an embodiment may be applied to an electronic system 410. The electronic system 410 may include a controller 411, an input/output unit 412, and a memory 413. The controller 411, the input/output unit 412 and the memory 413 may be coupled with one another through a bus 415 providing a path through which data are transmitted.

For example, the controller 411 may include at least any one of at least one microprocessor, at least one digital signal processor, at least one microcontroller, and logic devices capable of performing the same functions as these components. The controller 411 or the memory 413 may include at least any one of the embedded packages according to the embodiments of the present invention. The input/output unit 412 may include at least one selected among a keypad, a keyboard, a display device, a touch screen and so forth. The memory 413 is a device for storing data. The memory 413 may store data and/or commands to be executed by the controller 411, and the likes.

The memory 413 may include a volatile memory device such as a DRAM and/or a nonvolatile memory device such as a flash memory. For example, a flash memory may be mounted to an information processing system such as a mobile terminal or a desk top computer. The flash memory may constitute a solid state disk (SSD). In this case, the electronic system 410 may stably store a large amount of data in a flash memory system.

The electronic system 410 may further include an interface 414 configured to transmit and receive data to and from a communication network. The interface 414 may be a wired or wireless type. For example, the interface 414 may include an antenna or a wired or wireless transceiver.

The electronic system 410 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

In the case where the electronic system 410 is an equipment capable of performing wireless communication, the electronic system 410 may be used in a communication system such as of CDMA (code division multiple access), GSM (global system for mobile communications), NADC (north American digital cellular), E-TDMA (enhanced-time division multiple access), WCDMA (wideband code division multiple access), CDMA2000, LTE (long term evolution) and Wibro (wireless broadband Internet).

Figure 21:
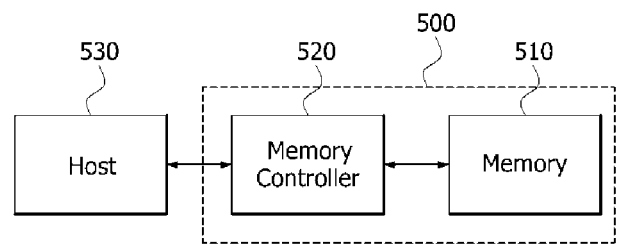
FIG. 21 is a block diagram illustrating an example of a memory card including the embedded package in accordance with various embodiments of the inventive concept.

Referring to FIG. 21, the embedded package in accordance with the embodiments may be provided in the form of a memory card 500. For example, the memory card 500 may include a memory 510 such as a nonvolatile memory device and a memory controller 520. The memory 510 and the memory controller 520 may store data or read stored data.

The memory 510 may include at least any one among nonvolatile memory devices to which the packaging technologies of the embodiments of the present invention are applied. The memory controller 520 may control the memory 810 such that stored data is read out or data is stored in response to a read/write request from a host 530.

The embodiments have been disclosed above for illustrative purposes. Those skilled in the art will appreciate that various modifications, additions and substitutions are possible, without departing from the scope and spirit of the inventive concept as disclosed in the accompanying claims.

What is claimed is:

1. An embedded package comprising:
    a chip attached to a first surface of a core layer;
    a plurality of bumps on a surface of the chip; and
    a first insulation layer surrounding the core layer, the chip and the plurality of bumps,
    wherein the first insulation layer has at least one trench disposed in a portion of the first insulation layer;
    and wherein the plurality of bumps are exposed in each trench.

2. The embedded package of claim 1, further comprising:
    a plurality of interconnection lines disposed on the first insulation layer and connected to respective ones of the plurality of bumps exposed by the trench.

3. The embedded package of claim 2, further comprising:
    a circuit pattern on the core layer,
    wherein at least one of the plurality of interconnection lines is electrically connected to the circuit pattern.

4. The embedded package of claim 3, wherein at least one of the plurality of interconnection lines is electrically connected to the circuit pattern through a via hole penetrating the first insulation layer.

5. The embedded package of claim 2, wherein the plurality of interconnection lines cover respective ones of the bumps and at least one of the interconnection lines extends in one direction.

6. The embedded package of claim 2, wherein at least one of the plurality of interconnection lines extends from one of the bumps in a first direction to cover a first sidewall of the trench and to expose a second sidewall of the trench opposite to the first sidewall.

7. The embedded package of claim 1, wherein the trench exposes top surfaces of the bumps.

8. The embedded package of claim 1, wherein the trench exposes top surfaces and upper sidewalls of the bumps.

9. The embedded package of claim 1, further comprising a second insulation layer covering the first insulation layer and the trench.

10. The embedded package of claim 1, wherein the bumps are arrayed in a line to be spaced apart from each other.

11. The embedded package of claim 1, wherein a depth of the trench is less than a thickness of the first insulation layer on a surface of the chip opposite to the core layer.

12. An embedded package comprising:
    a chip attached to a first surface of a core layer;
    a plurality of bumps classified into a first bump group and a second bump group disposed on a surface of the chip opposite to the core layer; and
    a first insulation layer surrounding the core layer, the chip and the plurality of bumps,
    wherein the first insulation layer includes a first trench and a second trench;
    and wherein the plurality of bumps of the first bump group are exposed in the first trench, and the plurality of bumps of the second bump group are exposed in the second trench.

13. The embedded package of claim 12, wherein the bumps in the first and second bump groups are arrayed in a line to be spaced apart from each other.

14. The embedded package of claim 12:
- wherein the bumps in the first bump group are arrayed in a line on a first edge of the chip; and
- wherein the bumps in the second bump group are arrayed in a line on a second edge of the chip opposite to the first edge.

15. The embedded package of claim 12, further comprising:
- a plurality of interconnection lines connected to respective ones of the bumps exposed by the first and second trenches,
- wherein the plurality of interconnection lines extend onto the first insulation layer.

16. The embedded package of claim 15, further comprising:
- a circuit pattern on the core layer,
- wherein at least one of the plurality of interconnection lines is electrically connected to the circuit pattern.

\* \* \* \* \*